(12) United States Patent
Chen

(10) Patent No.: US 7,459,792 B2
(45) Date of Patent: Dec. 2, 2008

(54) VIA LAYOUT WITH VIA GROUPS PLACED IN INTERLOCKED ARRANGEMENT

(75) Inventor: Jong Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 134 days.

(21) Appl. No.: 11/455,090

(22) Filed: Jun. 19, 2006

(65) Prior Publication Data
US 2007/0290361 A1    Dec. 20, 2007

(51) Int. Cl.
*H01L 23/48* (2006.01)
(52) U.S. Cl. ............... 257/774; 257/781; 257/E23.011; 257/E23.169; 257/773
(58) Field of Classification Search ............... 438/618, 438/637; 257/774, 773, 781, E23.011, E23.169
See application file for complete search history.

(56) References Cited

U.S. PATENT DOCUMENTS

| | | | |
|---|---|---|---|
| 6,822,329 B2* | 11/2004 | Varrot et al. ............... | 257/758 |
| 7,295,745 B2* | 11/2007 | Uchida ....................... | 385/129 |
| 7,323,784 B2* | 1/2008 | Yiu et al. ..................... | 257/774 |
| 2001/0009802 A1* | 7/2001 | Lee ............................. | 438/612 |
| 2003/0073257 A1* | 4/2003 | Watanabe .................... | 438/14 |
| 2004/0021227 A1* | 2/2004 | Watanabe .................... | 257/773 |
| 2008/0081461 A1* | 4/2008 | Lee et al. ..................... | 438/637 |

* cited by examiner

*Primary Examiner*—Thao P. Le
(74) *Attorney, Agent, or Firm*—Birch, Stewart, Kolasch & Birch, LLP

(57) ABSTRACT

Via layout with via groups placed in an interlocked arrangement for suppressing the crack propagation along the domain boundary between the via groups. A structure has a metal via pattern located in a dielectric layer and having a first via group and a second via group adjacent to each other. The first via group has at least two first line vias extending in a first direction, and the second via group has at least two second line vias extending in a second direction. The first via group and the second via group are placed in an interlocked arrangement, and a domain boundary along the first direction or the second direction between the first via group and said second via group is not straight.

11 Claims, 8 Drawing Sheets

VIA LAYOUT WITH VIA GROUPS PLACED IN INTERLOCKED ARRANGEMENT

TECHNICAL FIELD

The present invention relates to integrated circuit structures, and particularly to a via layout with via groups placed in an interlocked arrangement for a semiconductor device.

BACKGROUND

Wire bonds, physically, as well as electrically, connected to underlying circuitry, of semiconductor chips, are used to connect the specific semiconductor chip to packaging elements, such as printed circuit board, or ceramic modules. Bond pads are the interfaces between the integrated circuits contained in semiconductor chips and the chip package. A large number of bond pads are required to transmit power/ground and input/output signals to the chip devices. It is thus important that reliability of bond pad should be sufficiently high to ensure the life time of the device. The general bond pad consists of metal layers separated by inter-metal dielectric (IMD) layers and metal vias passing the IMD layers for electrically connecting the metal layers. A passivation layer covers the surface, except over the bonding sites, to seal the chip from contaminants and for scratch protection. Wires are bonded to the bond pad and to the chip package forming electrical connections between the chip and the package.

In most cases metal vias are patterned as an array of grids in the IMD layer underlying an uppermost metal layer. The large, exposed, surface area of IMD layer, however, surrounding the smaller regions of metal vias, can result in defect formation, as a result of the large bonding force experienced during the wire bonding tests, where the large bonding force is distributed throughout the overlying bond pad. A significant failure mode involves cracking of the IMD layer. Once a small crack is initiated to propagate along the IMD layer, under stresses it will grow extensively during subsequent processes. One approach for eliminating the cracks, the top metal via is designed as a mesh pattern. Such a mesh via pattern is often formed or deposited in a manner that can't fully fill holes to provide poor coverage on intersection areas where line vias cross with each other, mainly because of a marginal photolithography process window induced by circuits under pad (CUP) layout. This impacts reliability, bondability and quality control (QC) results, and the yield impact may reach 10~15% depending on variations in chip size. In order to avoid problems in devices that could arise from non-fully filled metal vias, design rules do not allow integrated circuits to underlie the bond pad.

The adhesion between the metal via and the IMD layer is also poor while the bonding wires are bonded to the bond pads by thermal compression, so that the bonding pads often peel off and the IMD layers often crack. FIG. 1 is a top view illustrating one approach for improving adhesion and solving the peeling issue. The metal vias 12, 14 and 16 formed in alternating IMD layers 10 are arranged in tetraskelion respectively, so that a compressive mechanical stress from any direction of the substrate can be released. Taking the top metal vias 12 as an example, each metal via 12a in the vertical-via pair is staggered and parallel to each other, and each metal via 12b in the horizontal-via pair is staggered and parallel to each other. However, the IMD layer 10 is a brittle oxide layer and a straight open space (as indicated by the dotted lines 13a and 13b) is existed between the vertical-via pair and the horizontal-via pair. There is one potential concern that the IMD oxide layer may propagate straightly along the space 13a or 13b.

FIG. 2 is a top view illustrating another approach for improving adhesion and solving the peeling issue. The top via pattern in a top-level IMD layer 20 is arranged in an array including via groups 22 and 24. The parallel lines vias 22a, 22b and 22c in the first via group 22 and the parallel line vias 24a, 24b and 24c in the second via group 24 extend in different directions without generating an intersection area there between, which avoids poor via coverage. However, a straight open space, as indicated by the dotted lines 23 and 25, is existed along the domain boundary between the two adjacent via groups 22 and 24. There is one potential concern that the brittle IMD layer 20 may propagate straightly along the space 23 or 25.

SUMMARY OF THE INVENTION

Embodiments of the present invention include a via layout with via groups placed in an interlocked arrangement for bond pad structures in order to avoid a straight open path existed along the domain boundary between two adjacent via groups. Also, embodiments of the present invention provide a dummy pattern layout with line groups placed in an interlocked arrangement around an active area or within a dummy region defined on a semiconductor substrate for improving critical dimension uniformity or thickness uniformity during chemical mechanical polishing.

In one aspect, the present invention provides a structure has a via pattern located in a dielectric layer and having a first via group and a second via group adjacent to each other. The first via group has at least two first line vias extending in a first direction, and the second via group has at least two second line vias extending in a second direction. The first via group and the second via group are placed in an interlocked arrangement, and a domain boundary along the first direction or the second direction between the first via group and said second via group is not straight.

In another aspect, the present invention provides a bond pad structure has a first metal layer overlying an integrated circuit substrate, a dielectric layer overlying the first metal layer, a second metal layer overlying the dielectric layer, and a metal via pattern located in the dielectric layer and electrically connecting the first metal layer and the second metal layer. The metal via pattern has a plurality of first via groups and second via groups arranged in an array. Each of the first via groups has at least two first line vias extending along a first direction, each of the second via groups has at least two second line vias extending along a second direction, and a domain boundary along the first direction or the second direction between the first via group and the second via group is not straight.

In another aspect, the present invention provides a semiconductor device has an active area defined on a semiconductor substrate, and a dummy pattern surrounding the active area on the semiconductor substrate. The dummy pattern comprises at least one first line group and at least one second line group adjacent to each other, the first line group comprises at least two first lines extending in a first direction, and the second line group comprises at least two second lines extending in a second direction different from the first direction. The first line group and the second line group are placed in an interlocked arrangement, and a domain boundary along the first direction between the first line group and the second line group is not straight.

In another aspect, the present invention provides a semiconductor device has a dummy region defined on a semiconductor substrate, and a dummy pattern placed in the dummy region of the semiconductor substrate. The dummy pattern comprises at least one first line group and at least one second line group adjacent to each other, the first line group comprises at least two first lines extending in a first direction, and the second line group comprises at least two second lines extending in a second direction different from the first direction. The first line group and the second line group are placed in an interlocked arrangement, and a domain boundary along the first direction between the first line group and the second line group is not straight.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
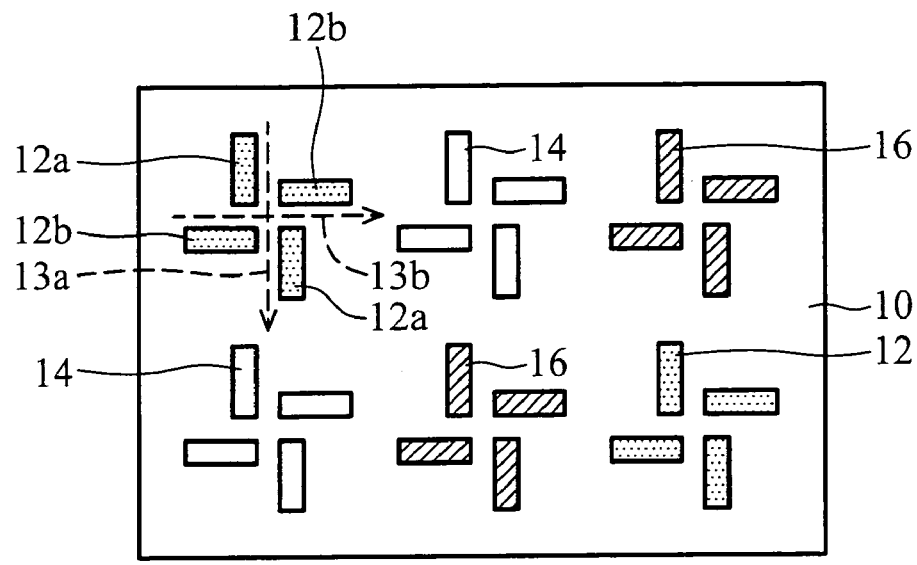
FIG. 1 is a top view illustrating one approach for improving adhesion and solving the peeling issue.
Figure 2:
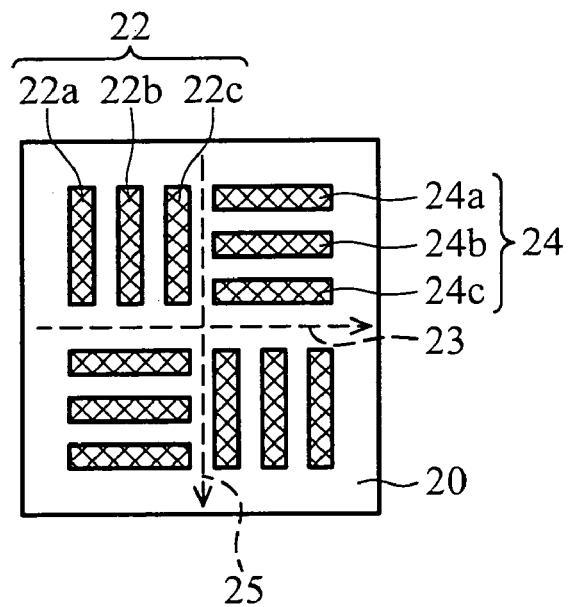
FIG. 2 is a top view illustrating another approach for improving adhesion and solving the peeling issue.

Embodiments of the present invention provide a via layout with via groups placed in an interlocked arrangement to overcome the aforementioned problems of the prior art arising from a straight open path existed along the domain boundary between the two adjacent via groups. The inventive via layout comprises at least two via groups consisting of line vias that keep a dense via density, which increases the via contact area with an overlying metal layer so as to improve adhesive results and prevent the overlying metal layer from peeling during subsequent processes (e.g., wire bonding process). The two adjacent via groups have line vias extending in different directions without generating an intersection area there between, which avoids poor via coverage. Particularly, the two adjacent via groups are arranged in an interlocked structure to avoid a straight open path existed along the domain boundary between the two adjacent via groups, which increases the toughness of the IMD layer and suppresses the potential concern of cracking propagation in the IMD layer so as to improve reliability, bondability and quality control results. In one embodiment, the via layout is used as a top via pattern for a bond pad structure. At least part of integrated circuits located under the bond pad structure, referred to as circuits under pad (CUP), is allowed for a more efficient use of chip area or a reduction of chip size. The present invention also provides value when using the via layout in any other conductive layer level, for example, a metal via pattern in any dielectric layers underlying an uppermost IMD layer for reinforcing an interconnection structure. In addition, the via layout is applied to a dummy pattern around an active area or within a dummy region defined on a semiconductor substrate for improving process controls in CD (critical dimension) uniformity or thickness uniformity during CMP (chemical mechanical polishing).

As used throughout this disclosure, the term "via" refers to a conductive material feature, such as an opening filled with a conductive material in a dielectric layer. The term "top via" or "top metal via" refers to a via pattern in an uppermost dielectric layer underlying an uppermost metal layer of a bond pad structure. For back-end-of-line (BEOL) interconnection technologies, the term "$M_{top}$ metal layer" refers to a first-level metal layer (e.g., the uppermost metal layer) fabricated as the top interconnection level metal layer, the term "$M_{top-1}$ metal layer" refers to a second-level metal layer fabricated underlying the $M_{top}$ metal layer, and the term "$M_{top-N}$ metal layer" refers to an $N_{th}$-level metal layer fabricated underlying the $M_{top-(N-1)}$ metal layer, wherein N is an integer equal to or larger than 1. Embodiments of the present invention use copper-based conductive materials for forming the $M_{top}$ metal layer, the $M_{top-N}$ metal layer and the metal via pattern. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection. Although the embodiments of the present invention illustrate copper interconnection patterns, the present invention also provides value when using metallic materials excluding copper for BEOL interconnection.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 3A:
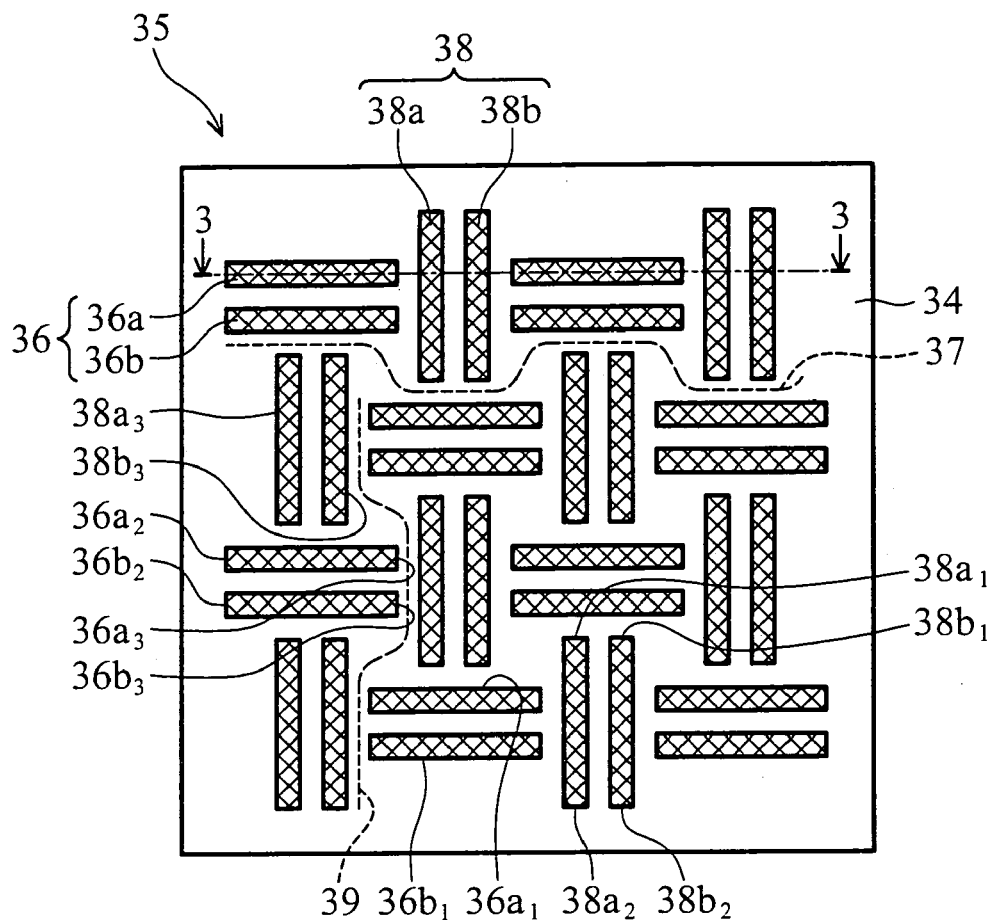
FIG. 3A is a plane view of illustrating an exemplary embodiment of a via layout.
Figure 3B:
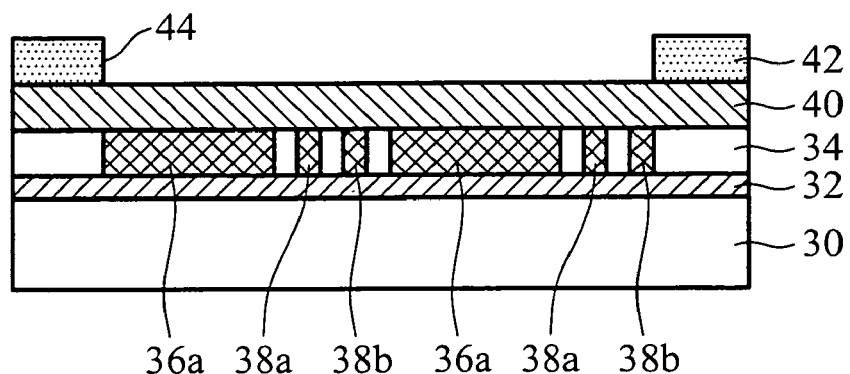
FIG. 3B is a cross sectional view illustrating a bond pad structure having a top via pattern along line 3-3 of FIG.3A.

Herein, a plane view of FIG. 3A illustrates an exemplary embodiment of a via layout, and a cross sectional view of FIG. 3B illustrates a bond pad structure having a top via pattern along line 3-3 of FIG.3A. An example of an integrated circuit substrate 30 used for interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a substrate comprising Ge, GaAs, GaP, InAs and InP. The integrated circuits as used herein refer to electronic circuits having multiple individual circuit elements, such as transistors, diodes, resistors, capacitors, inductors, and other active and passive semiconductor devices.

On the substrate 30, an inter-metal dielectric (IMD) layer 34 is fabricated as a top-level IMD layer which comprises a top via pattern 35 formed between a $M_{top-1}$ metal layer 32 and a $M_{top}$ metal layer 40. A passivation layer 42 is optionally formed on the $M_{top}$ metal layer 40 to define a pad window 44 including a bonding area, a probing area or a combination thereof. The $M_{top}$ metal layer 40 comprises a terminal contact region, which is a portion of conductive mutes and has an exposed surface (e.g., the pad window 44) in electrical communication with a metal pad and a bonding wire. For a more efficient use of chip area or a reduction of chip size, at least part of integrated circuits can be designed under a bond pad structure, resulting in a circuits under pad (CUP) region at the $M_{top}$ metal layer 40, the $M_{top-1}$ metal layer 32 or a $M_{top-N}$ metal layer. Suitable materials for the $M_{top-1}$ metal layer 32 and the $M_{top}$ metal layer 40 may include, but are not limited to, for example aluminum, aluminum alloy, copper, copper alloy, or other copper-based conductive materials. The IMD layer 34 is formed of a thickness of about 1000 angstroms to about 20000 angstroms through any of a variety of techniques, including, spin coating, CVD, PVD, plating, and future-developed deposition procedures. The IMD layer 34 may comprise $SiO_2$, $SiN_x$, SiON, PSG, BPSG, F-containing $SiO_2$, or various types of low-k films of a comparatively low dielectric constant dielectric material with a k value less than about 3.9, e.g., 3.5 or less. A wide variety of low-k materials may be employed in accordance with embodiments of the present invention, for example, spin-on inorganic dielectrics, spin-on organic dielectrics, porous dielectric materials, organic polymer, organic silica glass, fluorinated silicate glass (FSG), diamond-like carbon, HSQ (hydrogen silsesquioxane) series material, MSQ (methyl silsesquioxane) series material, or porous organic series material.

The top via pattern 35 comprises a plurality of metal-filled striped-shaped trenches, named line vias, which are substantially registered with first via groups 36 and second via groups 38 according to different extending directions of the line vias. The via groups 36 and 38 are arranged in an interlocked form for reinforcing the IMD layer 34 and suppressing the crack propagation along the domain boundary between the two adjacent via groups 36 and 38, which will be described in detail thereinafter. The number, dimension and interval of the line vias in the via groups 36 and 38 may be appropriately chosen specifically for requirements of via density, mechanical strength and device performance. For example, each of the first via groups 36 is located adjacent to each of the second via groups 38 such as to be arranged in a matrix array. Along each row (or column) of the matrix array, the first via groups 36 and the second via groups 38 are arranged in respectively different sequences in mutually adjacent rows (or columns). Each of the via groups 36 and 38 may be kept as a rectangular profile, a square profile, a quadrilateral profile or any other geometric profiles. Each of the first via groups 36 comprises at least two line vias 36a and 36b that extend in a first direction. Each of the second via groups 38 comprises at least two line vias 38a and 38b that extend in a second direction that is different from the first direction. For example, the first direction is substantially perpendicular to the second direction. For two adjacent via groups 36 and 38, each line via 36a or 36b of the first via group 36 may not be allowed to cross each line via 38a or 38b of the second via group 38 so as to avoid poor coverage at an intersection of two line vias. The arrangement, number and dimension of the line vias in one via group are not limited in the present invention. For example, the line vias of one via group may be randomly distributed.

Herein, the term "interlocked arrangement" means that the domain boundary along one direction between the two adjacent via groups 36 and 38 is not straight. For example, the outer side $36a_1$ of the line via 36a is not leveled off with the first ends $38a_1$ and $38b_1$ of the line vias 38a and 38b, and the outer side $36b_1$ of the line via 36b is not leveled off with the second ends $38a_2$ and $38b_2$ of the line vias 38a and 38b. Thus the domain boundary along the first direction (substantially along the longitudinal direction of the line vias 36a and 36b) between the two adjacent via groups 36 and 38, as indicated by the dotted line 37, is curved or distorted. Similarly, the first ends $36a_2$ and $36b_2$ of the line vias 36a and 36b are not leveled off with the outer side $38a_3$ of the line via 38a, and the second ends $36a_3$ and $36b_3$ of the line vias 36a and 36b are not leveled off with the outer side $38b_3$ of the line via 38b. Thus the domain boundary along the second direction (substantially along the longitudinal direction of the line via 38a and 38b) between the two adjacent via groups 36 and 38, as indicated by the dotted line 39, is curved or distorted. This interlocked arrangement can reinforce the toughness of the IMD layer 34 and provide a non-straight open path (the non-straight domain boundary 37 or 39), thus the cracking propagation in the MD layer 34 can be suppressed.

Figure 3C:
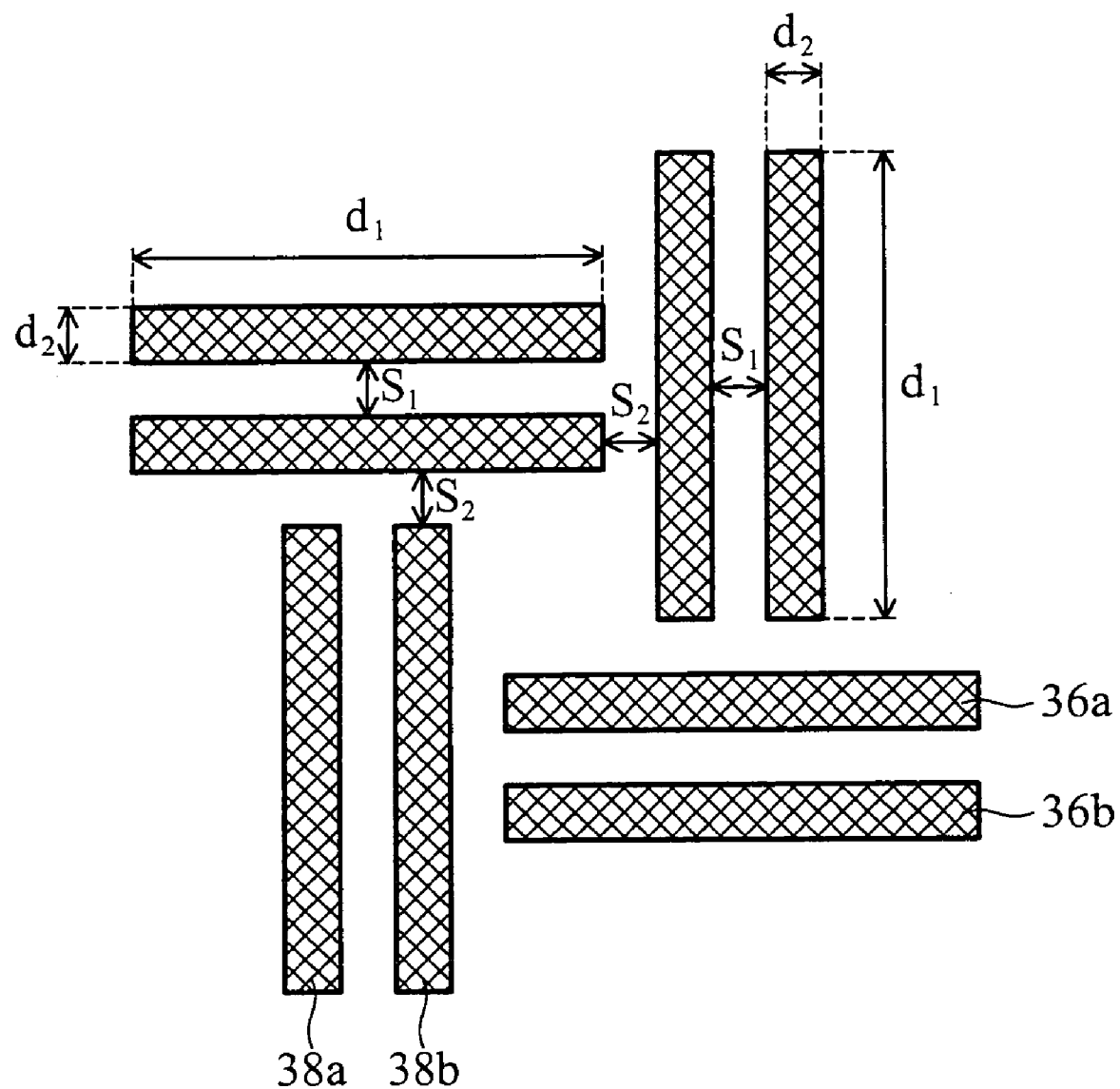
FIG. 3C is a plane view illustrating an exemplary embodiment of a dimension design for the line vias.

The line vias may be separated from each other with an appropriate distance allowed by a predetermined design rule. FIG. 3C is a plane view illustrating an exemplary embodiment of a dimension design for the line vias. The line vias 36a, 36b and the line vias 38a, 38b have the length $d_1$, the width $d_2$, the space $s_1$ kept between two line vias and the space $s_2$ kept between two via groups. In one embodiment, the length $d_1$ of the line via is between about 0.1 μm to 5.0 μm, the width $d_2$ of the line via is between about 0.05 μm to 5 μm, the space $s_1$ between two line vias within one via group is between about 0.05 μm to 5 μm, and the space $s_2$ between two via groups is between about 0.05 μm to 5.0 μm. In other embodiments, the dimensions of $d_1$, $d_2$, $s_1$ and $s_2$ may be modified with appropriate values allowed by a predetermined design rule. Although the embodiment of the present invention illustrates line vias having an identical size in via groups, the present invention provides value when using line vias having different features in dimension and shape compared with each other in one via group or between two via groups. In addition, the line vias 36a, 36b, 38a and 38b within the pad window 44 have a dense via density which provides a contact area between the top vias and the $M_{top}$ metal layer sufficient to avoid the metal pad from peeling in a subsequent wire bonding process. The term "via density" is defined as the area occupied by metal vias divided by the total area of the metal vias and the space between the metal vias. In one embodiment, the top via pattern 35 including the via groups 36 and 38 within the pad window 44 has a via density greater than 5%, for example approaching about 5% to 50%.

The top via pattern 35 is formed in the IMD layer 34 by the use of any well-known process. For example, a plurality of openings corresponding in position to the line vias (e.g., 36a, 36b, 38a, 38b) is formed in the IMD layer 34 to expose portions of the $M_{top-1}$ metal layer 32 by the use of a typical lithographic and anisotropic etching operation (e.g., plasma etching or reactive ion etching). Filling the openings with conductive material is then accomplished, in one embodiment of the invention, using tungsten plug processes. It is to be appreciated other well-known plug process such as aluminum plug, copper plug, or silicide plug processes. Following the metal filling process, chemical mechanical polishing (CMP) may be used to planarize the surface if necessary. The $M_{top}$ metal layer 40, the passivation layer 42 for defining the pad window 44, a metal pad and a bonding wire are then accomplished according to procedures well known to those versed in the art. Although the embodiment of the present invention illustrate the via groups formed in the uppermost IMD layer, the present invention provides value when forming such via groups in two-level metal stack bond pad structures and up to eight-level metal stack bond pad structures for copper interconnection systems.

Figure 4A:
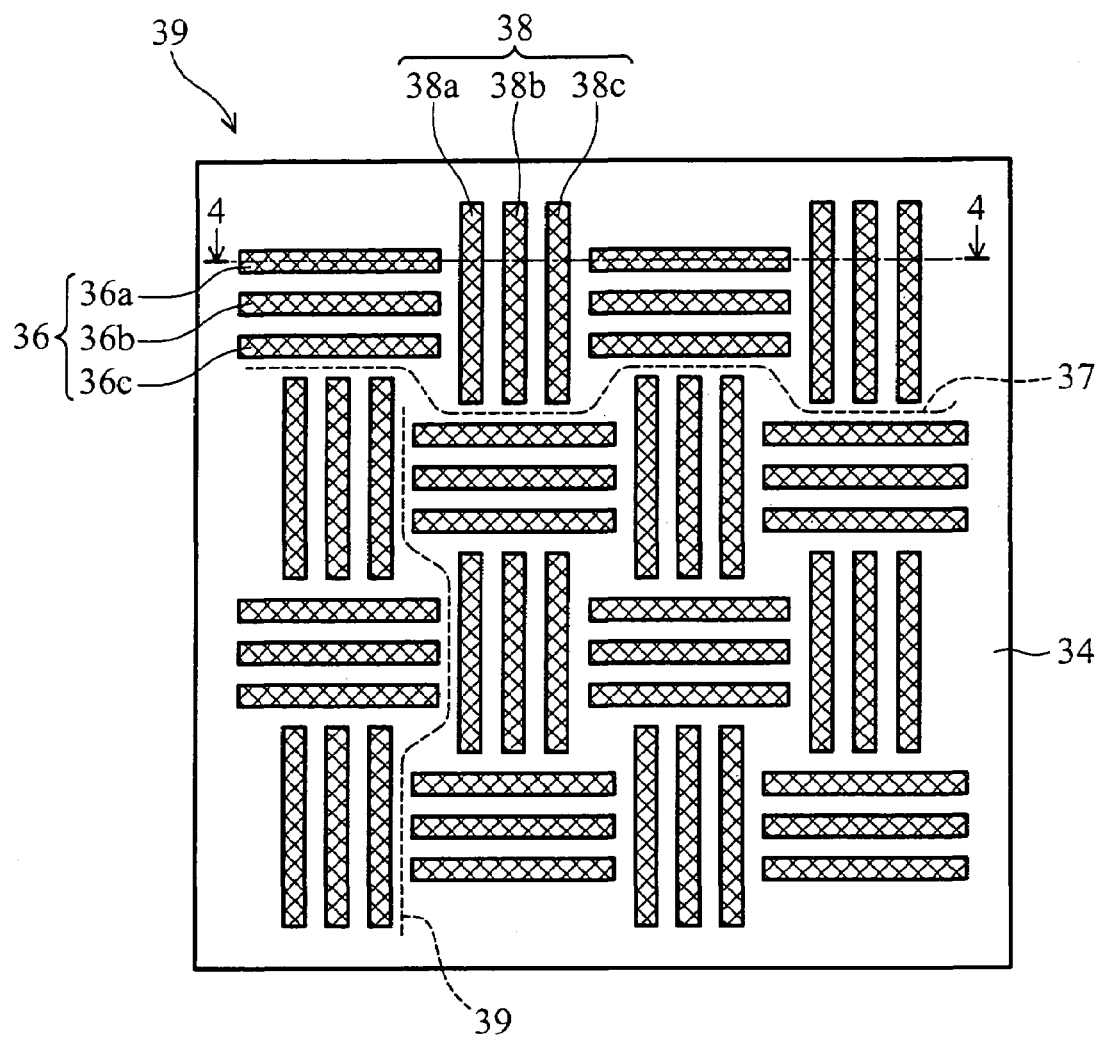
FIG. 4A is a plane view illustrating an exemplary embodiment of a via layout.
Figure 4B:
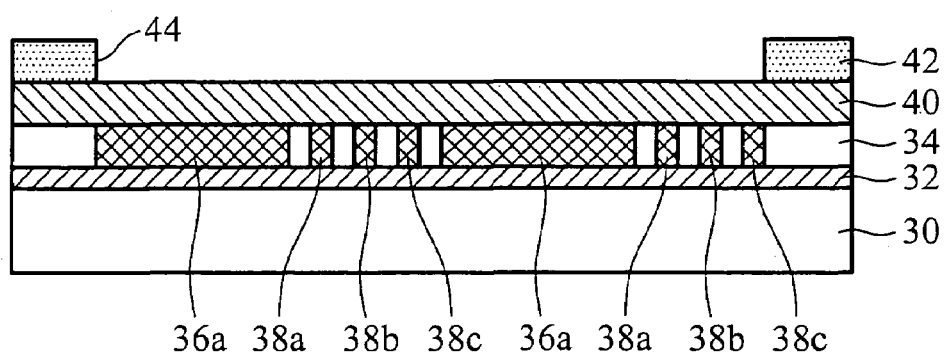
FIG. 4B is a cross sectional view illustrating a bond pad structure having a top via pattern along line 4-4 of FIG.4A.
Figure 4C:
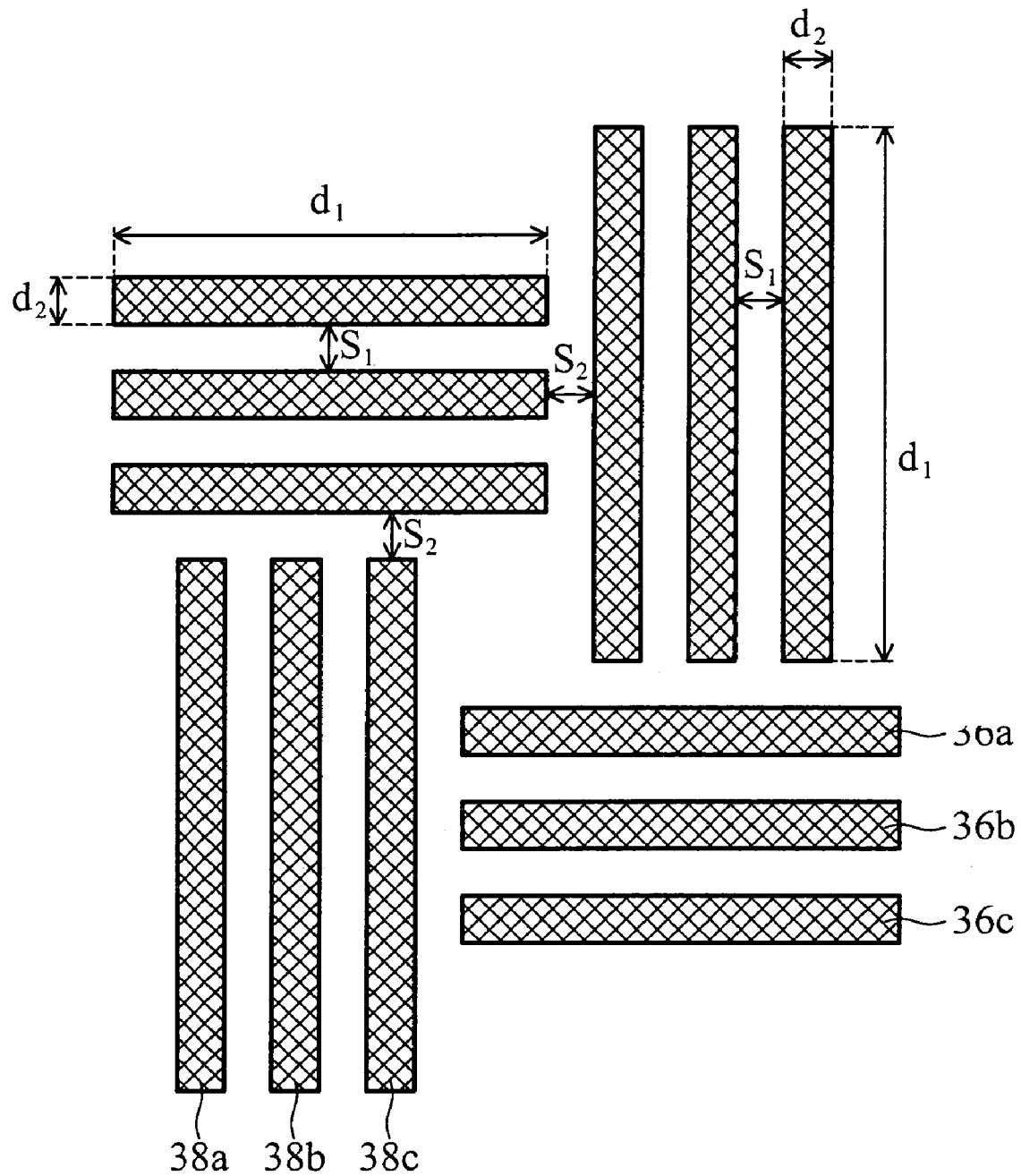
FIG. 4C is a plane view illustrating an exemplary embodiment of a dimension design for the line vias.

Herein, a plane view of FIG. 4A illustrates an exemplary embodiment of a via layout, a cross sectional view of FIG. 4B illustrates a bond pad structure having a top via pattern along line 4-4 of FIG. 4A, and a plane view of FIG. 4C illustrates an exemplary embodiment of a dimension design for the line vias. Explanation of the same or similar portions to the description in FIGS. 3A to 3C is omitted herein. Compared with the top via pattern 35, in an embodiment of providing a top via pattern 39 with a denser via pattern, the first via group 36 comprises three line vias 36a, 36b and 36c, and the second via group 38 comprises three line vias 38a, 38b and 38c. Particularly, the first via groups 36 and the second via groups 38 are placed in an interlocked arrangement, where the domain boundary between the two adjacent via groups 36 and 38 is not straight (e.g., a curved or distorted boundary indicated as the dotted lines 37 or 39). This interlocked arrangement can increase the toughness of the IMD layer 34 and suppress the potential cracking propagation in the IMD layer 34 along the non-straight domain boundary 37 and 39. Also, each line via 36a, 36b or 36c of the first via group 36 is not allowed to cross each line via 38a, 38b or 38c of the second via group 38 so as to avoid poor coverage at an intersection of two line vias so as to improve reliability, bondability and quality control results. In one embodiment, the length $d_1$ of the line via is between about 0.1 μm to 5.0 μm, the width $d_2$ of the line via is between about 0.05 μm to 5.0 μm, the space $s_1$ between two line vias within one via group is between about 0.05 μm to 5.0 μm, and the space $s_2$ between two via groups is between about 0.05 μm to 5.0 μm. The top via pattern 39 including the via groups 36 and 38 within the pad window 44 has a via density greater than 5%, for example approaching about 5% to 50%.

Figure 5:
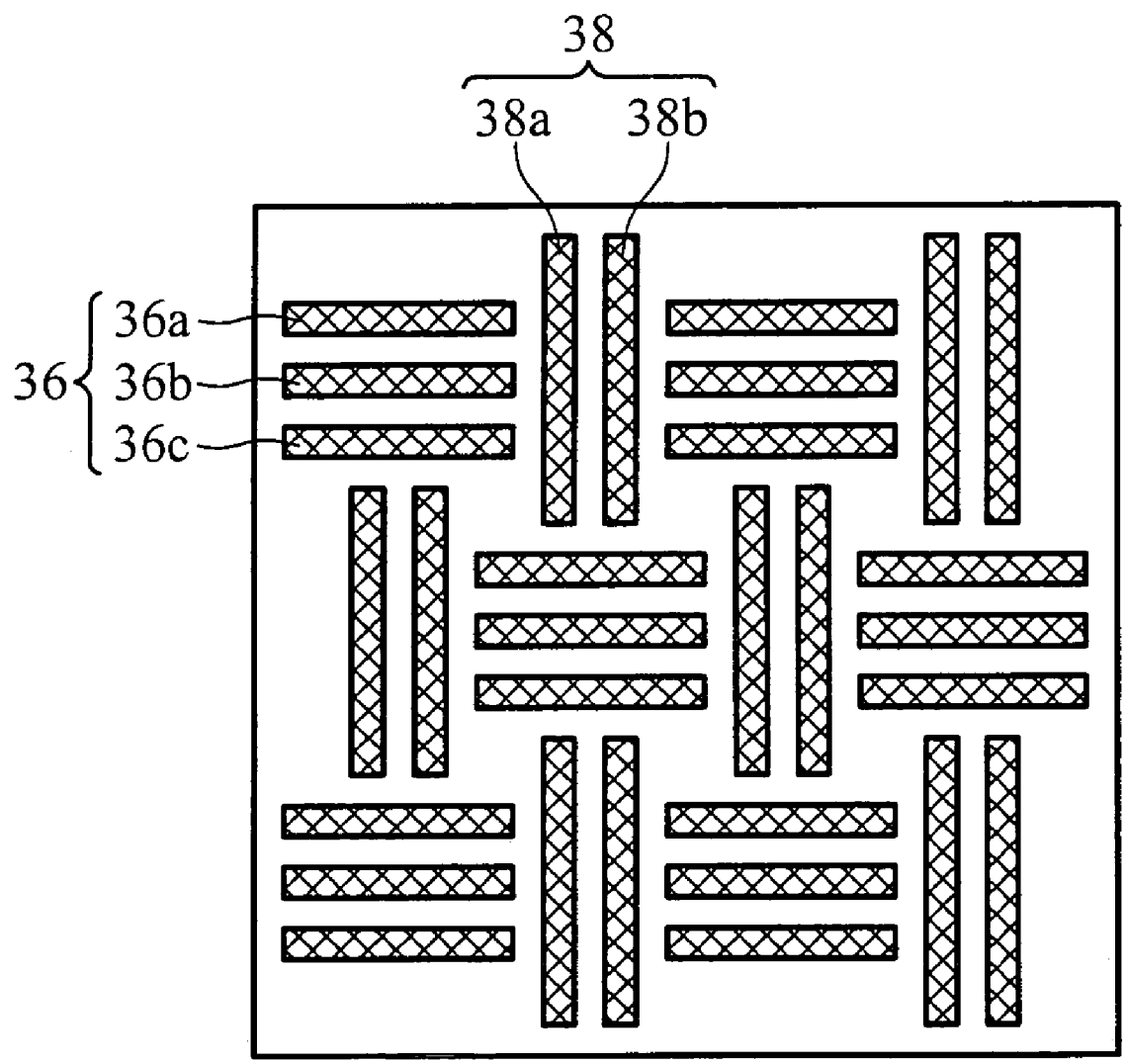
FIG. 5 is a plane view illustrating an exemplary embodiment of a via layout.

The number of the line vias in the first via group 36 and the second via group 38 may be the same or different depending on requirements of via density, layout area and device performance. In a plane view of FIG. 5 illustrating an exemplary embodiment of a via layout, the first via group 36 comprises three line vias 36a, 36b and 36c, and the second via group 38 comprises two line vias 38a and 38b. The asymmetrical design by adjusting the number of line vias in different via groups can meet a better performance, which comes to a compromise between the bond pad size and the via density.

Except for the top via designs for the bond pad structure in the back-end process, the inventive via layout may be applied to other conductive layer level for improving process controls in CD uniformity or thickness uniformity during CMP. CMP can be performed on both dielectric and metal (or on both dielectric and polysilicon) to produce good local planarization. However, the existence of pattern effect in films has a problem that a micro-loading effect occurs due to a difference in pattern density and degrades the uniformity of pattern sizes. Due to a difference in the etching/polishing rate of a film from one location to another, the amount of reaction produced by the etching/polishing becomes locally dense or sparse. To counteract this effect, the circuit layout is modified and dummy patterns are added to locations with appropriate pattern density. The adding of dummy patterns helps to achieve uniform effective pattern density across the wafer.

Thus the inventive via layout inserted onto the wafer prior to the CMP process can make the pattern density more uniform in IC chips, i.e., to help level the feature density across the layout. The number, size and space of the line vias in one via group can be appropriated adjusted to meet the best performance, which comes to a compromise between electrical field and capacitance of the original conductive lines. For example, the inventive via layout can be formed as a dummy feature during forming conductive layers in gate level or any other interconnection level.

Figure 6A:
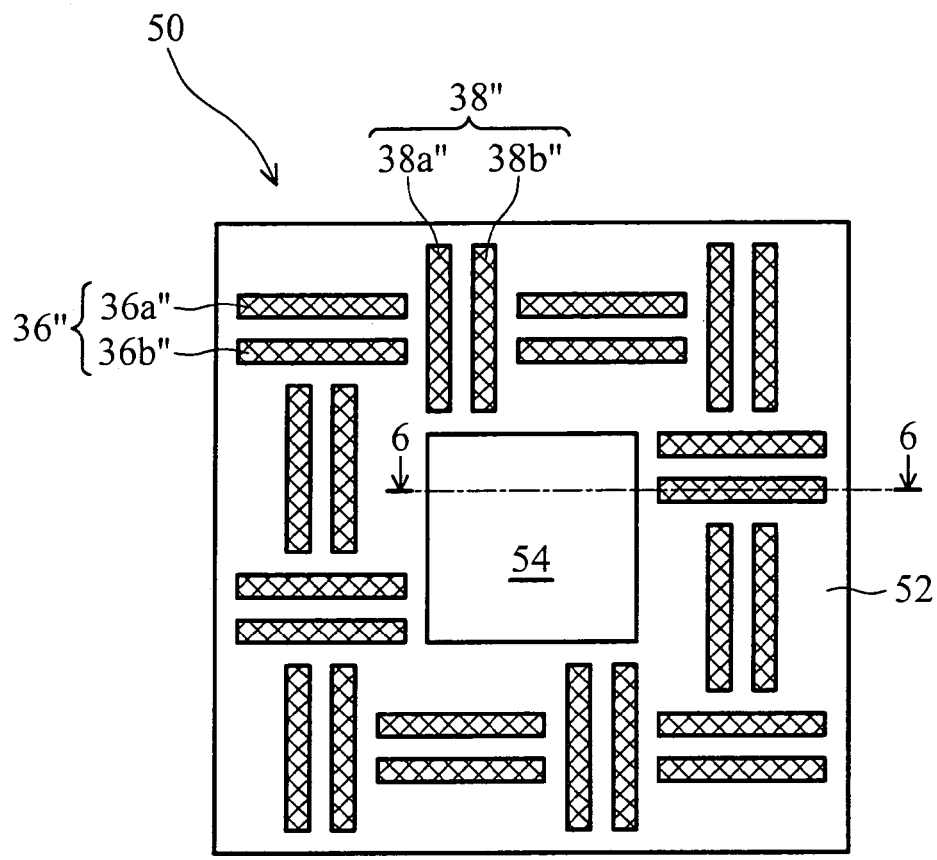
FIG. 6A is a plane view illustrating an exemplary embodiment of a dummy pattern layout surrounding an active area.
Figure 6B:
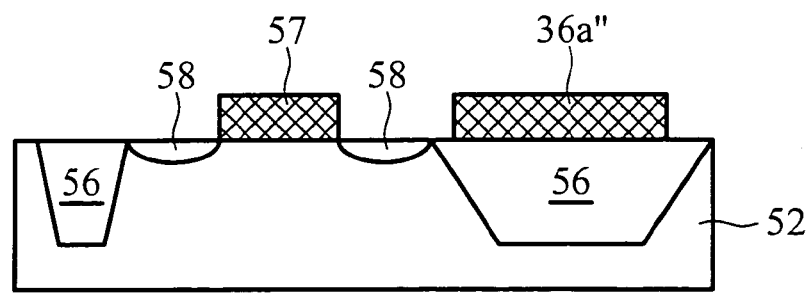
FIG. 6B is a cross sectional view illustrating a dummy pattern along line 6-6 of FIG. 6A.
Figure 7A:
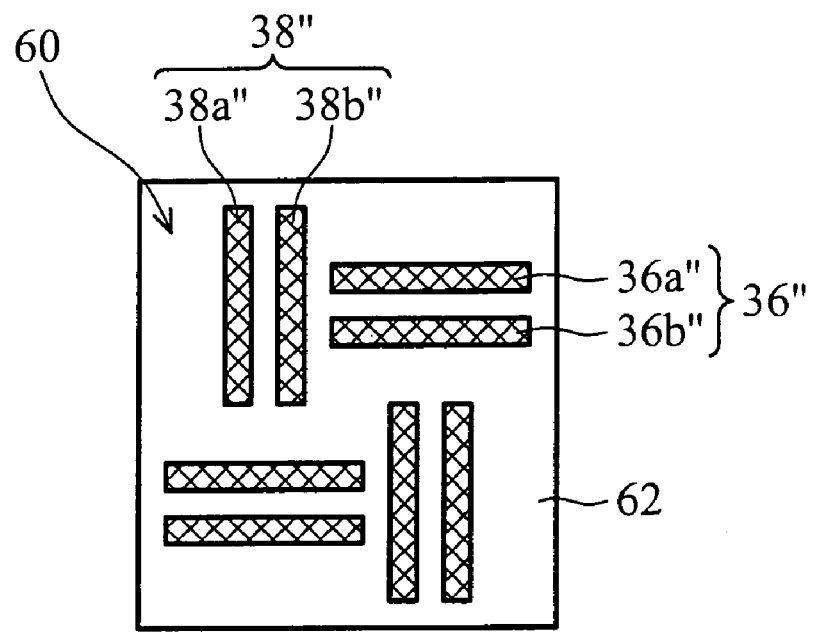
FIG. 7A is a plane view illustrating an exemplary embodiment of a dummy pattern in a dummy region.
Figure 7B:
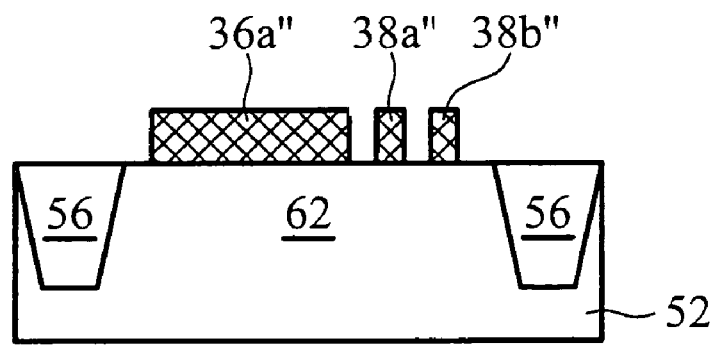
FIG. 7B is a cross sectional view illustrating a dummy pattern between isolation regions.

Herein, a plane view of FIG. 6A illustrates an exemplary embodiment of a layout for providing a dummy pattern surrounding an active area, and a cross-sectional diagram of FIG. 6B illustrates the dummy pattern over an isolation region along line 6-6 of FIG. 6A. An active area 54 is defined on a semiconductor substrate 52 through the use of isolation regions 56, such as shallow trench isolation regions. The active area 54 refers to a circuit-permitted region or an oxide defined (OD) region, where a gate electrode 57 and source/drain regions 58 are fabricated thereon. The dummy pattern 50 includes line groups 36" and 38" fabricated on the isolation region 56 without overlapping the active area 54. Placement requirements of the lines 36a", 36b", 38a", 38b" of the line groups 36" and 38" are the same as the line vias 36a, 36b, 38a and 38b of the via groups 36 and 38 described in FIGS. 3 to 5 and therefore are omitted herein. The gate electrode 57 and the dummy pattern 50 preferably comprise the same material, which allows for simultaneously forming both structures using conventional methods. In one embodiment, the gate electrode 57 and the dummy pattern 50 preferably comprise polysilicon. Except for the active area 54, the dummy pattern 50 may be placed to surround other effective regions, such as an impurity diffusion region, or a boundary region between n-wells and p-wells, which are also defined on the semiconductor substrate 52 through the isolation regions 56. In addition, the inventive via layout can be used as another dummy pattern 60 within a dummy region 62 as shown in a plane view of FIG. 7A and a cross-sectional view of FIG. 7B. The dummy region 62 is a circuit-prohibited region (referring to a non-active area or a dummy OD region), which may be designed around active areas and defined by the isolation regions 56. The dummy pattern 60 is therefore fabricated on the dummy region 62 between the isolation regions 56. The dummy pattern 60 includes line groups 36" and 38". Placement requirements of the lines 36a", 36b", 38a", 38b" of the line groups 36" and 38" are the same as the line vias 36a, 36b, 38a and 38b of the via groups 36 and 38 described in FIGS. 3 to 5 and therefore are omitted herein. The dummy pattern 60 may comprise polysilicon or a conductive material the same as the gate electrode, which allows for simultaneously forming both structures using conventional methods.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A structure, comprising:
    a dielectric layer formed overlying an integrated circuit substrate; and
    a via pattern located in said dielectric layer and comprising a plurality of first via groups and a plurality of second via groups adjacent to each other;

wherein each of said first via groups comprises at least two first line vias extending in a first direction, and each of said at least two first line vias has two opposite ends in said first direction, wherein each of said second via groups comprises at least two second line vias extending in a second direction different from said first direction, and each of said at least two second line vias in said second direction has two opposite ends in said second direction, wherein, said first via groups and said second via groups are placed in an interlocked arrangement, and a domain boundary along said first direction between said first via groups and said second via groups is not straight, and wherein an extension line extending along said first direction and from one of said opposite ends of each of said at least two first line vias of each of said first via groups crosses said at least two second line vias of a corresponding one of said second via groups. and an extension line extending along said second direction and from one of said opposite ends of each of said at least two second line vias of each of said second via groups crosses said at least two first line vias of a corresponding one of said first via groups.

2. The structure of claim 1, wherein a domain boundary along said second direction between said first via groups and said second via groups is not straight.

3. The structure of claim 1, wherein said first line via does not cross said second line via.

4. The structure of claim 1, wherein said first via groups and said second via groups are arranged in a matrix array.

5. The structure of claim 1, wherein said via pattern is formed in a bond pad structure.

6. The structure of claim 5, wherein said integrated circuit substrate comprises an integrated circuit located under said bond pad structure.

7. The structure of claim 1, wherein each of said first line vias and said second line vias is a opening filled with a conductive material in said dielectric layer.

8. The structure of claim 7, wherein each of said first line vias and said second line vias comprises copper or a copper-based material.

9. The structure of claim 1, wherein said via pattern has a via density greater than 5%.

10. The structure of claim 1, wherein said first direction is substantially perpendicular to said second direction.

11. The structure of claim 1, wherein no line via in each of said first via groups is perpendicular to the first line vias in said first direction, and no line via in each of said second via groups is perpendicular to said second line vias in the second direction.

* * * * *